(12) United States Patent
Kawamura (10) Patent No.: US 7,877,867 B2
(45) Date of Patent: Feb. 1, 2011

(54) COMPONENT FIXING METHOD (75) Inventor: Yoshihiro Kawamura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 174 days.

(21) Appl. No.: 12/117,126

(22) Filed: May 8, 2008

(65) Prior Publication Data

US 2008/0285246 A1    Nov. 20, 2008

(30) Foreign Application Priority Data

May 11, 2007    (JP) .............................. 2007-126604

(51) Int. Cl.
*H05K 3/30* (2006.01)

(52) U.S. Cl. ............................. 29/832; 29/852; 29/840; 29/25.41; 361/807

(58) Field of Classification Search ........... 29/832–834, 29/830–831, 846–847, 25.03, 25.35–25.42; 361/762–767, 807–812; 174/255–259, 262–264; 438/3, 396, 692–693
See application file for complete search history.

(56) References Cited

U.S. PATENT DOCUMENTS

| | | | | |
|---|---|---|---|---|
| 4,572,843 | A * | 2/1986 | Saito et al. .................. | 427/554 |
| 6,225,133 | B1 * | 5/2001 | Yamamichi et al. ............ | 438/3 |
| 6,998,696 | B2 * | 2/2006 | Casper et al. ................ | 257/528 |
| 7,100,277 | B2 * | 9/2006 | Borland et al. ................ | 29/832 |
| 7,586,754 | B2 * | 9/2009 | Kawamura ................... | 361/767 |
| 2008/0285246 | A1 * | 11/2008 | Kawamura ................... | 361/779 |

FOREIGN PATENT DOCUMENTS

JP    4-247685 A    9/1992

\* cited by examiner

*Primary Examiner*—Minh Trinh
(74) *Attorney, Agent, or Firm*—Sughrue Mion, PLLC (57) ABSTRACT

A resist having a predetermined thickness is formed on a printed circuit board except for portions of the printed circuit board that oppose a convex portion of a component when the component is mounted on the printed circuit board. A silk screen printed layer having a predetermined thickness is formed on the resist. Thereafter, a concave portion of the component is bonded to the silk screen printed layer using double coated tape having a predetermined thickness. The component is mounted such that the convex portions of the component oppose the portions of the printed circuit board that do not have a resist formed thereon. The sum of the thicknesses of the resist, the silk screen printed layer and the double coated tape is larger than a height difference between the concave portion and the convex portion of the component.

6 Claims, 9 Drawing Sheets

COMPONENT FIXING METHOD

BACKGROUND OF THE INVENTION

1. Field of the Invention

This invention relates to a component fixing method suitably used for mounting a film condenser (film capacitor) (used in a high-voltage circuit) on a printed circuit board (PCB).

2. Description of the Related Art

Figure 7:
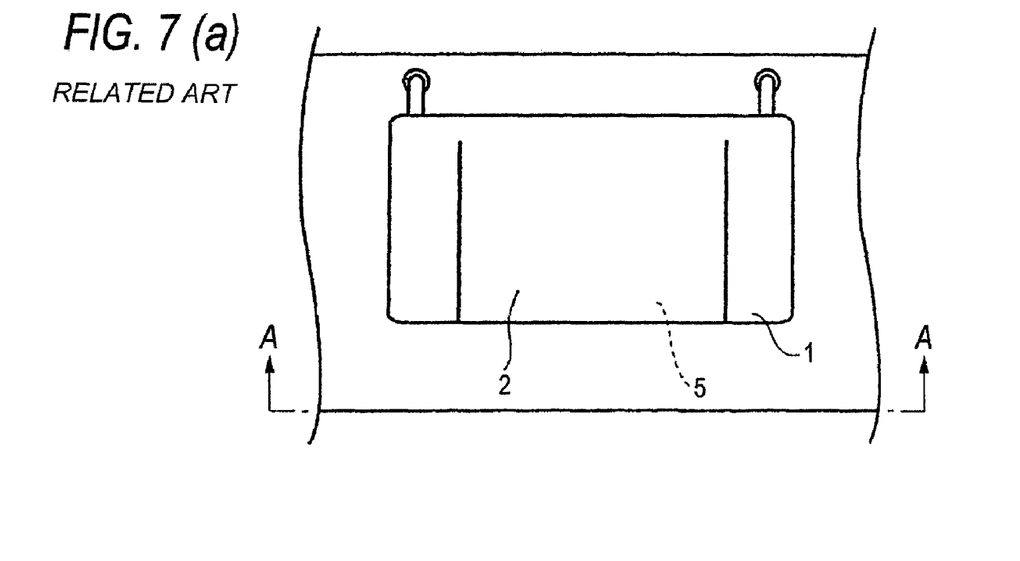
FIG. 7A is a plan view.
FIG. 7B is a cross-sectional view taken along the line A-A of FIG. 7A.
Figure 8:
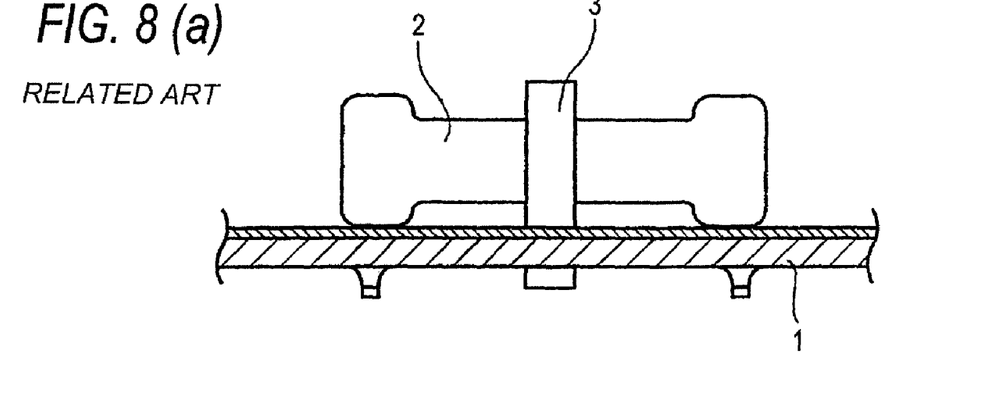
FIGS. 8A and 8B are cross-sectional views showing two conventional examples in which a film capacitor is fixed to a printed circuit board by a conventional mechanical fixing method.
Figure 9:
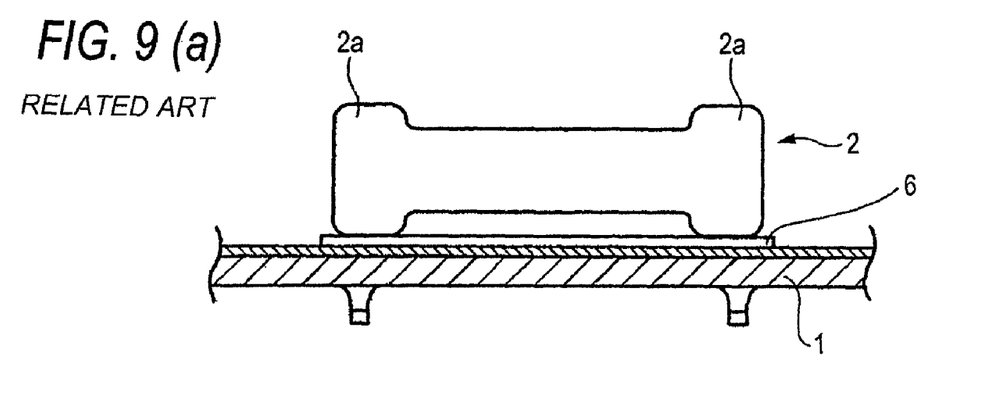
FIG. 9A is the view showing a condition in which an adhesive double coated tape is bonded to a lower surface of the film capacitor over an entire area thereof.
FIG. 9B is the view showing a condition in which an adhesive double coated tape is bonded only to a lower surface of a concave portion of the film capacitor.
FIG. 9C is the view showing a condition in which a thin adhesive double coated tape is used.

FIG. 7 show a conventional adhesively-bonding method, and FIG. 8 shows a conventional mechanical fixing method. FIG. 9 shows conventional taping methods, and FIG. 9A is a cross-sectional view showing a condition in which an adhesive double coated tape is bonded to a lower surface of a film capacitor over an entire area thereof, and FIG. 9B is a cross-sectional view showing a condition in which an adhesive double coated tape is bonded only to a lower surface of a concave portion of a film capacitor, and FIG. 9C is a cross-sectional view showing a condition in which a thin adhesive double coated tape is used.

Film capacitors of this kind must be increased in size so as to withstand a high pressure. Therefore, when mounting the film capacitor on a printed circuit board of an on-vehicle equipment or the like liable to be affected by vibrations, it is highly necessary to fix the film capacitor to the printed circuit board to thereby enhance a vibration resistance so that large stresses due to vibrations will not act on soldered portions and lead portions.

As such a film capacitor fixing method, there has heretofore been extensively used a method (i.e., adhesively-bonding method) of adhesively bonding a film capacitor 2 to a printed circuit board 1 by an adhesive 5 as shown in FIG. 7. Also, as shown in FIGS. 8A and 8B, there can be proposed a method (i.e., mechanically fixing method) of mechanically fixing a film capacitor 2 to a printed circuit board 1 by a fixing member 3. Further, as shown in FIG. 9, there has been proposed a method (i.e., taping method) of bonding the film capacitor 2 to a printed circuit board 1 by the adhesive double coated tape 6 (see, for example, Patent Literature 1).

Patent Literature 1: JP-A-4-247685

However, these three kinds of fixing methods have respective problems still remaining unsolved as described below.

First, in the adhesively-bonding method, the influence of environment-affecting substances (such as a volatile organic compound (VOC)) contained in the adhesive 5 has developed into a social problem, and besides it is difficult to control a bonding strength because of problems with respect to the amount of coating of the adhesive, coating portions, the drying time, the handling until the drying operation, etc.

The mechanical fixing method lacks in reliability and compactness. Namely, a variation in outer size of the film capacitor 2 is large because of its producing process, and therefore it is difficult to surely fix the film capacitor. Incidentally, in the case where the film capacitor 2 is of the encased type, that is, is housed in a case, a variation in outer size is small, but there is encountered a drawback that the overall size of the film capacitor 2 increases because of the provision of the case. In addition, stresses on the soldered portions and the printed circuit board 1 are increased by the fixing operation using the fixing member 3. Furthermore, the overall size in a mounted condition of the film capacity increases because of the use of the fixing member 3.

In the taping method, various disadvantages described below are encountered even when the adhesive double coated tape 6 is bonded to any portion of the lower surface of the film capacitor 2. The taping method lacks in economy and reliability.

Namely, when the adhesive double coated tape 6 is bonded to the lower surface of the film capacitor over the entire area thereof as shown in FIG. 9A, the actual bonding areas are limited to electrode portions 2a although the area of the adhesive double coated tape 6 is large. As a result, there is encountered an irrational situation in which although the material cost for the adhesive double coated tape 6 increases because of an increased amount of the used adhesive double coated tape 6, the bonding strength is lowered because of the reduced bonding area. In addition, the mounting height is certainly increased by an amount corresponding to the thickness of the adhesive double coated tape 6, and therefore the film capacitor is liable to resonate, and stresses develop at the soldered portions and legs (lead wires) of the film capacitor. Even when the adhesive double coated tape 6 is bonded only to the electrode portions 2a of the film capacitor 2, the problems with respect to the lowered bonding strength, the resonance and the stresses can not be solved.

On the other hand, in order that the adhesive double coated tape 6 can be bonded only to the lower surface of the concave portion 2b of the film capacitor 2 as shown in FIG. 9B, the adhesive double coated tape 6 need to have a thickness larger than a concave-convex height difference L1. As a result, the mounting height is certainly increased by an amount corresponding to the difference between the thickness of the adhesive double coated tape 6 and the concave-convex height difference L1. In addition, since the adhesive double coated tape 6 has the increased thickness, the material cost for the adhesive double coated tape 6 increases, and also the risk of increasing the amount of environment-affecting substances becomes high. However, if the adhesive double coated tape 6 is decreased in thickness, there is a fear that the concave-convex height difference L1 of the film capacitor 2 can not be absorbed, thus resulting in defective adhesive bonding, as shown in FIG. 9C.

SUMMARY OF THE INVENTION

This invention has been made in view of the above circumstances, and an object of the invention is to provide a component fixing method capable of solving the above problems.

A component fixing method of fixing a concave-convex mounting component to a printed circuit board wherein the method comprises:

a resist forming step of forming a resist printed layer of a predetermined thickness on the printed circuit board except a convex portion-opposing portion thereof;

a printing step of forming a silk screen printed layer of a predetermined thickness on the resist printed layer; and a component bonding step of bonding a concave portion of the concave-convex mounting component to the silk screen printed layer by an adhesive double coated tape of a predetermined thickness in such a manner that a convex portion of the concave-convex mounting component is opposed to the convex portion-opposing portion of the printed circuit board; and in the component bonding step, the sum of the thicknesses of the resist printed layer, silk screen printed layer and adhesive double coated tape is not smaller than a concave-convex height difference of the convex-concave mounting component which is the difference in height between the concave portion and the convex portion.

In the component fixing method as defined above, the concave-convex mounting component is a film capacitor of a generally rectangular parallelepiped shape, and opposite end portions of the film capacitor have electrode portions, respectively, and serve respectively as the convex portions, and that portion of the film capacitor lying between the convex portions serves as the concave portion recessed relative to the convex portions.

In the present invention, the concave-convex mounting component (such as a film capacitor) can be surely fixed to a board such as a printed circuit board. Therefore, for example, even in the case where a large-size film capacitor is fixed to the printed circuit board of an on-vehicle equipment liable to be affected by vibrations, large stresses will not act on soldered portions and lead portions, and therefore a vibration resistance is enhanced.

And besides, unlike the conventional adhesively-bonding method, an adhesive is not used, and the problem with respect to environment-affecting substances can be solved, and at the same time difficulty involved in the control of a bonding strength can be overcome. Furthermore, the method of the invention is more excellent in reliability and compactness as compared with the conventional mechanical fixing method. Furthermore, unlike the conventional taping method, the method of the invention is excellent in economy and reliability.

BRIEF DESCRIPTION OF THE DRAWINGS

FIGS. 1A to 1D is a process view showing a first embodiment of a component fixing method of the present invention.

FIGS. 5A to 5B is a process view showing a second embodiment of a component fixing method of the invention.

FIGS. 6A to 6B is a process view showing a third embodiment of a component fixing method of the invention.

FIGS. 7A to 7B shows a condition in which a film capacitor is fixed to a printed circuit board by a conventional adhesively-bonding method.

FIGS. 9A to 9C are cross-sectional views showing three conventional examples in which a film capacitor is fixed to a printed circuit board by a conventional taping method.

DESCRIPTION OF THE PREFERRED EMBODIIMENTS

Preferred embodiments of the present invention will now be described with reference to the drawings.

First Embodiment

Figure 1:
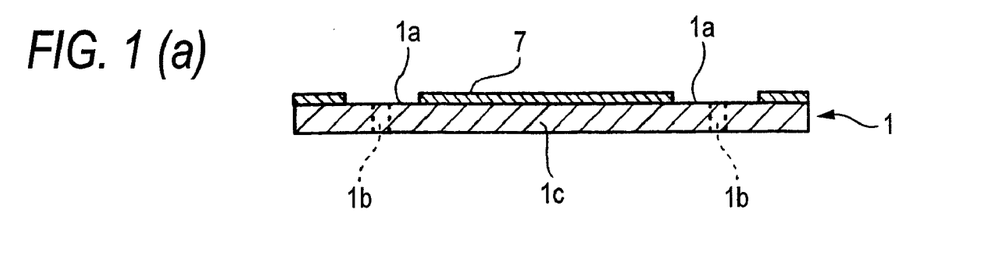
FIG. 1A is a cross-sectional view showing a resist forming step.
FIG. 1B is a cross-sectional view showing a printing step.
FIGS. 1C and 1D are cross-sectional views showing a component bonding step.
Figure 2:
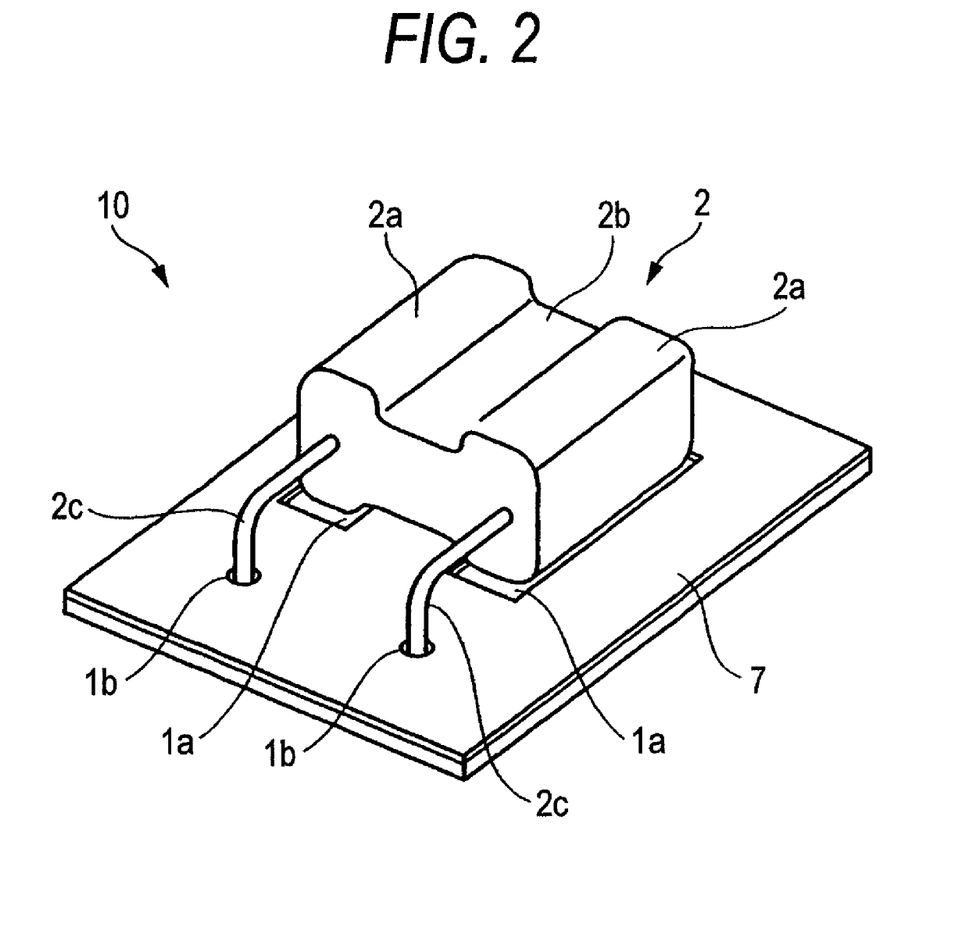
FIG. 2 is a perspective view showing a circuit component.

FIGS. 1A to 1D is a process view showing a first embodiment of a component fixing method of the invention, and FIG. 1A is a cross-sectional view showing a resist forming step, FIG. 1B is a cross-sectional view showing a printing step, and FIGS. 1C and 1D are cross-sectional views showing a component bonding step. FIG. 2 is a perspective view showing a circuit component, FIG. 3 is a plan view of the circuit component of FIG. 2, and FIG. 4 is a front-elevational view of the circuit component of FIG. 2.

Figure 3:
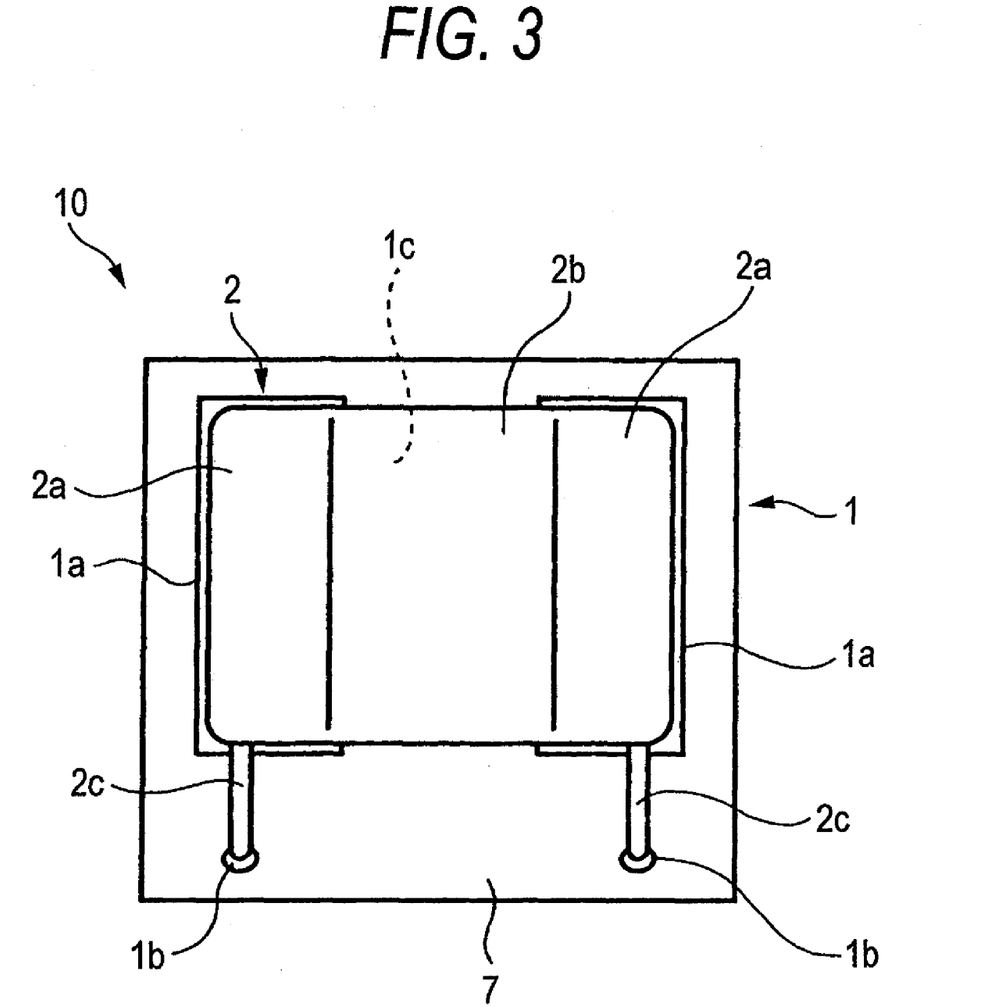
FIG. 3 is a plan view of the circuit component of FIG. 2.
Figure 4:
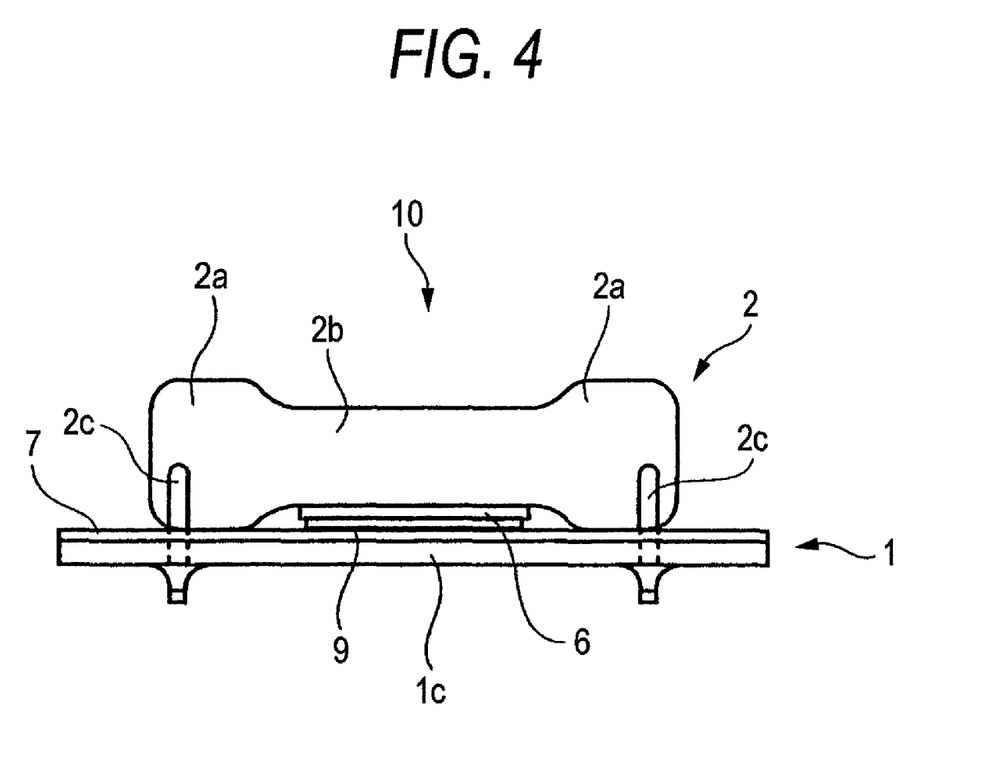
FIG. 4 is a front-elevational view of the circuit component of FIG. 2.

As shown in FIGS. 2 to 4, the circuit component 10 includes a flat plate-like printed circuit board (PCB) 1, and a film capacitor 2 is mounted in a laid-down posture on the printed circuit board 1. Namely, two lead passage holes 1$b$ are formed through the printed circuit board 1. On the other hand, the film capacitor 2 comprises a pair of electrode portions 2$a$, a concave portion 2$b$ interconnecting these electrode portions 2$a$, and a pair of lead wires 2$c$ extending respectively from the electrode portions 2$a$. The lead wires 2$c$ of the film capacitor 2 are passed respectively through the lead passage holes 1$b$ in the printed circuit board 1, and are soldered to the printed circuit board 1.

As shown in FIGS. 2 to 4, the film capacitor 2 is fixed to the printed circuit board 1. Namely, a resist printed layer 7 having a thickness 30 μm is formed on an entire surface of the printed circuit board 1 except electrode-opposing portions 1$a$ thereof (that is, portions opposed respectively to the electrode portions 2$a$ of the film capacitor 2). A printed layer (silk screen printed layer) 9 having a thickness 30 μm is formed on the resist printed layer 7 only at a concave portion-opposing portion 1$c$ (that is, a portion opposed to the concave portion 2$b$ of the film capacitor 2). The concave portion 2$b$ of the film capacitor 2 is bonded to an upper side of the silk screen printed layer 9 via an adhesive double coated tape 6 having a thickness 150 μm.

As shown in FIG. 1C, the film capacitor 2 has a concave-convex height difference L1 (that is, the amount of recessing of the concave portion 2$b$ relative to the pair of electrode portions 2$a$) of 200 μm. Therefore, the sum L2 (210 μm) of the thicknesses of the resist printed layer 7, silk screen printed layer 9 and adhesive double coated tape 6 is larger than the concave-convex height difference L1 (200 μm) by an amount (clearance) L3 (10 μm), and each electrode portion 2$a$ of the film capacitor 2 is spaced a distance (clearance) L3 (10 μm) from the printed circuit board 1.

The circuit component 10 has the above construction, and therefore the procedure for mounting the film capacitor 2 in a laid-down posture on the printed circuit board 1 is carried out in the following manner.

First, in the resist forming step, a resist material is coated on the printed circuit board 1 to form the resist printed layer 7 having a thickness of 30 μm as shown in FIG. 1A. At this time, the resist material is not coated on the electrode-opposing portions 1$a$ of the printed circuit board 1.

Then, the process shifts to the printing step, and silk screen printing (screen printing) is applied to the resist printed layer 7, thereby forming the silk screen printed layer 9 of a thickness of 30 μm thereon, as shown in FIG. 1B.

Thereafter, the process shifts to the component bonding step, and the concave portion 2$b$ of the film capacitor 2 is bonded to the silk screen printed layer 9 by the adhesive double coated tape 6 having a thickness of 150 μm. At this time, one adhesive surface of the adhesive double coated tape 6 is bonded to the concave portion 2$b$ of the film capacitor 2 as shown in FIG. 1C, and then the other adhesive surface of the adhesive double coated tape 6 is bonded to the silk screen printed layer 9 as shown in FIG. 1D. In preparation for the next step (soldering step), the lead wires 2$c$ of the film capacitor 2 are passed respectively through the lead passage holes 1$b$ of the printed circuit board 1 simultaneously with this component bonding operation.

At this time, since the resist printed layer 7 is not formed on the electrode-opposing portions 1$a$ of the printed circuit board 1 (that is, the portions to which the electrode portions 2a of the film capacitor 2 are opposed, respectively), there can be avoided a situation in which the mounting height is increased by the formation of the resist printed layer 7. And besides, it is sufficient that the adhesive double coated tape 6 should have the thickness generally equal to a value obtained by subtracting the combined thicknesses of the resist printed layer 7 and silk screen printed layer 9 from the concave-convex height difference L1, and therefore the material cost for the adhesive double coated tape 6 can be reduced, and also the amount of environment-affecting substances can be reduced. Furthermore, the other adhesive surface of the adhesive double coated tape 6 is bonded to the silk screen printed layer 9 formed on the resist printed layer 7, and therefore the bonding strength of the adhesive double coated tape 6 can be more increased as compared with the case where this tape 6 is bonded directly to the resist printed layer 7.

Finally, the process shifts to the soldering step, and the lead wires 2c of the film capacitor 2 are soldered to the printed circuit board 1. A soldering method may be a flow type or a reflow type. Of course, a manual soldering operation using a soldering iron can be adopted.

Here, the mounting operation of the film capacitor 2 relative to the printed circuit board 1 is finished.

Thus, unlike the conventional adhesively-bonding method, the adhesive 5 is not used, and therefore the problem with respect to the environment-affecting substances can be solved, and at the same time difficulty involved in the control of the bonding strength can be overcome.

In addition, the fixing method of this embodiment is more excellent in reliability and compactness as compared with the conventional mechanical fixing method. Namely, unlike the conventional mechanical fixing method, the film capacitor 2 can be surely fixed. And, there are not encountered situations in which stresses on the soldered portions and the printed circuit board 1 are increased because of the fixing operation using the fixing member 3 and in which the size in the mounted condition is increased because of the use of the case or the fixing member 3.

Furthermore, unlike the conventional taping method, the fixing method of this embodiment is excellent in economy and reliability. Namely, the adhesive double coated tape 6 is not bonded to the lower surface of the film capacitor 2 over the entire area thereof, but is bonded only to the concave portion 2b of the film capacitor 2. Therefore, there will not be encountered an irrational situation (see FIG. 9A) in which although the material cost for the adhesive double coated tape 6 increases because of the increased amount of the used adhesive double coated tape 6, the bonding strength is lowered because of the reduced bonding area. Furthermore, the printing step of forming the silk screen printed layer for the purpose of fixing the mounting component such as the film capacitor 2 in a stable manner can be carried out simultaneously or substantially simultaneously (in a continuous manner) with a step of forming a silk screen printed layer for the purpose of indicating characters and others on the printed circuit board 1. Therefore, it is not necessary to form the silk screen printed layer at a different step, and the introduction of the technique of this embodiment is easy. Furthermore, the mounting height will not be increased by an amount corresponding to the thickness of the adhesive double coated tape 6, and therefore resonance can be suppressed, so that there can be avoided a situation in which stresses develop at the soldered portions and the legs (lead wires) of the film capacitor 2.

As described above, each electrode portion 2a of the film capacitor 2 is spaced from the printed circuit board 1, and therefore even when a fine projection is formed on the electrode portion 2a of the film capacitor 2 or on the electrode-opposing portion 1a of the printed circuit board 1, the operation for bonding the film capacitor 2 can be carried out without any trouble.

Second and Third Embodiments

Figure 5:
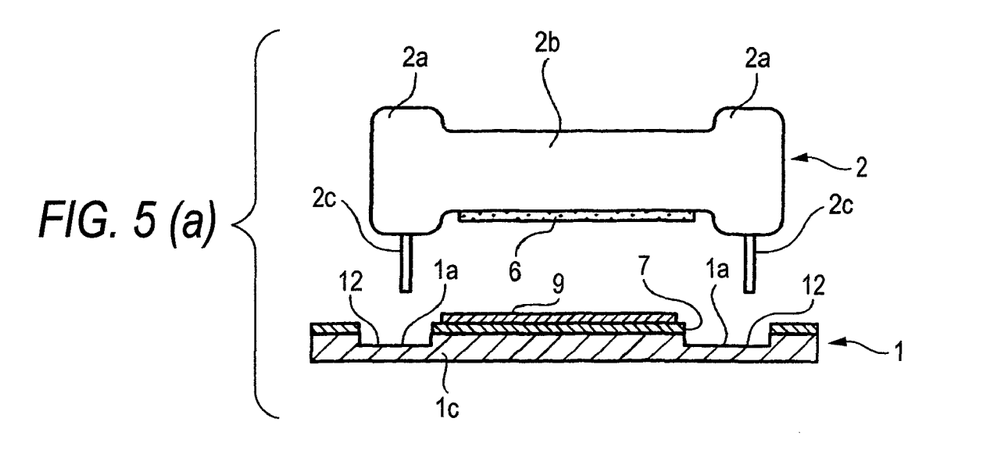
FIG. 5A is a cross-sectional view showing a condition before a film capacitor is bonded to a printed circuit board.
FIG. 5B is a cross-sectional view showing a condition after the film capacitor is bonded to the printed circuit board.
Figure 6:
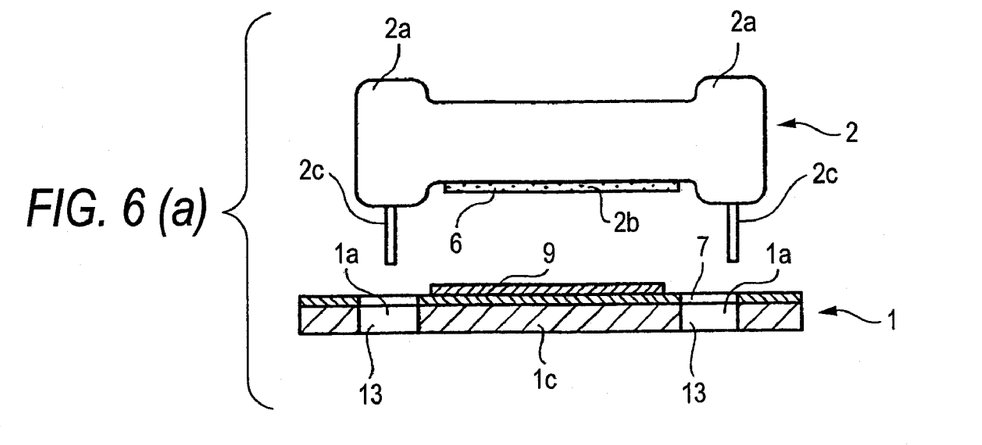
FIG. 6A is a cross-sectional view showing a condition before a film capacitor is bonded to a printed circuit board.
FIG. 6B is a cross-sectional view showing a condition after the film capacitor is bonded to the printed circuit board.

FIG. 5 is a process view showing a second embodiment of a component fixing method of the invention, and FIG. 5A is a cross-sectional view showing a condition before a film capacitor is bonded to a printed circuit board, and FIG. 5B is a cross-sectional view showing a condition after the film capacitor is bonded to the printed circuit board. FIG. 6 is a process view showing a third embodiment of a component fixing method of the invention, and FIG. 6A is a cross-sectional view showing a condition before a film capacitor is bonded to a printed circuit board, and FIG. 6B is a cross-sectional view showing a condition after the film capacitor is bonded to the printed circuit board.

In the above first embodiment, the resist material is coated on the printed circuit board 1 except the electrode-opposing portions 1a thereof, and by doing so, the electrode portions 2a of the film capacitor 2 are spaced from the printed circuit board 1, and therefore these electrode portions 2a are prevented from interfering with the printed circuit board 1.

In the second embodiment, however, bores 12 having a predetermined depth are beforehand formed respectively in electrode-opposing portions 1a of the printed circuit board 1 as shown in FIG. 5A, and when bonding the film capacitor 2 to the printed circuit board 1, electrode portions 2a of the film capacitor 2 are received respectively in the bores 12, and by doing so, the electrode portions 2a of the film capacitor 2 can be prevented from interfering with the printed circuit board 1.

In the third embodiment, slits 13 are formed respectively through electrode-opposing portion 1a of the printed circuit board 1 as shown in FIG. 6A, and when bonding the film capacitor 2 to the printed circuit board 1, electrode portions 2a of the film capacitor 2 are received respectively in the slits 13, and by doing so, the electrode portions 2a of the film capacitor 2 can be prevented from interfering with the printed circuit board 1.

In the case where the bores 12 or the slits 13 are formed respectively in the electrode-opposing portions 1a of the printed circuit board 1 as described above, the thickness of the silk screen printed layer 9 and the thickness of the adhesive double coated tape 6 can be reduced. As a result, the material for the required silk screen printed layer 9 as well as the material for the required adhesive double coated tape 6 can be reduced. In addition, the mounting height of the film capacitor 2 can be decreased, and therefore the resonance is further suppressed.

Other Embodiments

In the above first embodiment, the thicknesses of the resist printed layer 7, silk screen printed layer 9 and adhesive double coated tape 6 are given merely as one example, and are not limited to the above-mentioned values.

In the above first embodiment, in order to prevent the electrode portions 2a of the film capacitor 2 from interfering with the printed circuit board 1, the resist material is coated on the printed circuit board 1 except the electrode-opposing portions 1a, and by doing so, the electrode portions 2a of the film capacitor 2 is spaced from the printed circuit board 1. However, a dummy pattern (not shown) can be printed under the silk screen printed layer 9, thereby increasing the mounting height of the film capacitor 2 by an amount corresponding to a thickness of this dummy pattern, and by doing so, the electrode portions 2a of the film capacitor 2 can be spaced from the printed circuit board 1.

In the above first embodiment, when the film capacitor 2 is fixed to the printed circuit board 1, each electrode portion 2a of the film capacitor 2 is spaced the distance (clearance L3) of 10 μm from the printed board 1. However, this clearance L3 is not limited to 10 μm.

In the above first embodiment, although the film capacitor 2 is mounted on the printed circuit board 1, the present invention can be applied to the case where the film capacitor 2 is mounted on other board than the printed circuit board 1.

In the above first embodiment, the film capacitor 2 is used as the concave-convex mounting component, and the electrode portions 2a serve as the convex portions. However, the invention can be applied to other concave-convex component (such for example as a resistor) than the film capacitor 2 and also to other convex portions than the electrode portions 2a.

In the above embodiment, although the silk screen printed layer 9 is formed on the resist printed layer 7 by silk screen printing, other printed layer (such for example as a printed layer formed by offset printing) than the silk screen printed layer 9 can be formed in so far as the adhesive double coated tape 6 can be suitably adhesively bonded to it.

The present invention can be extensively applied to various fields of industry such as an automobile, an aircraft, an electric train, a manufacturing plant, an electric appliance, an office automation equipment, etc.

What is claimed is:

1. A component fixing method of fixing a component comprising a convex portion and a concave portion to a printed circuit board such that the concave and convex portions oppose the printed circuit board, the method comprising:
   a resist forming step comprising forming a resist printed layer having a predetermined thickness on said printed circuit board, wherein the resist printed layer is formed on a portion of the printed circuit board that opposes the concave portion, but the resist printed layer is not formed on a portion of the printed circuit board that opposes the convex portion;
   a printing step comprising forming a silk screen printed layer having a predetermined thickness on said resist printed layer; and
   a component bonding step comprising bonding the concave portion of the component to the silk screen printed layer using an adhesive double coated tape having a predetermined thickness, such that the convex portion of the component opposes the portion of the printed circuit board that does not have the resist printed layer formed thereon; and
   wherein, in said component bonding step, a sum of the thicknesses of the resist printed layer, the silk screen printed layer and the adhesive double coated tape is greater than a height difference between the concave portion and the convex portion.

2. The component fixing method according to claim 1, wherein the component is a film capacitor;
   wherein the convex portion includes first and second convex portions respectively disposed at opposite ends of the film capacitor, wherein the opposite ends of the film capacitor each comprise an electrode portion; and
   wherein the concave portion of the component is formed by a portion of the film capacitor between the first convex portion and the second convex portion, and wherein said concave portion is recessed relative to the first convex portion and the second convex portion.

3. The component fixing method according to claim 1, wherein the thicknesses of the resist printed layer, the silk screen printed layer and the adhesive double coated tape are measured in a direction that is substantially perpendicular to a surface of the printed circuit board; and
   wherein the height of the concave portion and the convex portion is measured in a direction that is substantially perpendicular to the surface of the printed circuit board when the component is mounted on the printed circuit board.

4. A component fixing method of fixing a component comprising a convex portion and a concave portion to a printed circuit board such that the concave and convex portions oppose the printed circuit board, the method comprising:
   a bore forming step comprising forming a bore to a predetermined depth in the portion of the printed circuit board that opposes the convex portion;
   a resist forming step comprising forming a resist printed layer having a predetermined thickness on said printed circuit board, wherein the resist printed layer is formed on a portion of the printed circuit board that opposes the concave portion, but the resist printed layer is not formed on a portion of the printed circuit board that opposes the convex portion;
   a printing step comprising forming a silk screen printed layer having a predetermined thickness on said resist printed layer; and
   a component bonding step comprising bonding the concave portion of the component to the silk screen printed layer using an adhesive double coated tape having a predetermined thickness, such that the convex portion of the component opposes the bore; and
   wherein a sum of the depth of the bore, the thickness of the resist printed layer, the thickness of the silk screen printed layer and the thickness of the adhesive double coated tape is greater than a height difference between the concave portion and the convex portion.

5. The component fixing method according to claim 4, wherein the depth of the bore and the thicknesses of the resist printed layer, the silk screen printed layer and the adhesive double coated tape are measured in a direction that is substantially perpendicular to a surface of the printed circuit board; and
   wherein the height of the concave portion and the convex portion is measured in a direction that is substantially perpendicular to the surface of the printed circuit board when the component is mounted on the printed circuit board.

6. The component fixing method according to claim 4, wherein the bore extends through the thickness of the printed circuit board such that it forms a hole.

* * * * *